US006490218B1

(12) United States Patent
Vyvoda et al.

(10) Patent No.: US 6,490,218 B1
(45) Date of Patent: Dec. 3, 2002

(54) DIGITAL MEMORY METHOD AND SYSTEM FOR STORING MULTIPLE BIT DIGITAL DATA

(75) Inventors: Michael A. Vyvoda, Fremont, CA (US); N. Johan Knall, Sunnyvale, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/932,701

(22) Filed: Aug. 17, 2001

(51) Int. Cl.$^7$ ................................................ G11C 7/00
(52) U.S. Cl. ............... 365/225.7; 365/184; 365/189.01; 365/189.07
(58) Field of Search ............................. 365/225.7, 184, 365/189.07, 189.01

(56) References Cited

U.S. PATENT DOCUMENTS

| | | | |
|---|---|---|---|
| 5,153,462 A | * 10/1992 | Agrawal et al. ............... 326/39 |
| 5,264,740 A | * 11/1993 | Wright ........................ 327/63 |
| 5,414,829 A | 5/1995 | Fandrich et al. |
| 6,034,882 A | * 3/2000 | Johnson et al. .............. 365/103 |
| 6,134,141 A | * 10/2000 | Wong ...................... 365/185.03 |
| 6,151,246 A | * 11/2000 | So et al. ................. 365/185.09 |
| 6,181,603 B1 | 1/2001 | Jyouno et al. |
| 6,219,282 B1 | * 4/2001 | Tanaka .................. 365/185.33 |
| 6,222,762 B1 | * 4/2001 | Guterman et al. ...... 365/185.03 |
| 6,236,587 B1 | 5/2001 | Gudesen et al. ............. 365/105 |
| 6,363,008 B1 | * 3/2002 | Wong ..................... 365/185.03 |
| 6,376,282 B1 | * 4/2002 | Corisis ........................ 438/121 |

OTHER PUBLICATIONS

"Intel StrataFlash™ Memory Technology Development and Implementation," Fazio et al., Intel Technology Journal, 13 pages (Q4'1997).
"A 125mm² 1Gb NAND Flash Memory with 10MB/s Program Throughput," Nakamura et al., ISSCC 2002/Session 6/SRAM and Non–Volatile Memories/6.4, 2002 IEEE International Solid–State Circuits Conference, Digest of Technical Papers, pp. 106–107 (2002).

"On the Go With Sonos," White et al., Circuits & Devices, pp. 22–31 (Jul. 2000).
"NROM: A Novel Localized Trapping, 2–Bit Nonvolatile Memory Cell," Eitan et al., IEEE Electron Device Letters, vol. 21, No. 11, pp. 543–545 (Nov. 2000).
"A 512Mb NROM Flash Data Storage Memory with 8MB/s Data Rate," Maayan et al, ISSCC 2002/Session 6/SRAM and Non–Volatile Memories/6.1, 2002 IEEE International Solid–State Circuits Conference, Digest of Technical Papers, pp. 100–101 (2002).
"Ovonic Unified Memory—A High–Performance Nonvolatile Memory Technology for Stand–Alone Memory and Embedded Applications," Gill et al., ISSCC 2002/Session 12/TD Digital Directions/12.4, 2002 IEEE International Solid–State Circuits Conference, Digest of Technical Papers, pp. 202–203 (2002).
"0.13 $\mu$m Metal–Oxide–Nitride–Oxide–Semiconductor Single Transistor Memory Cell with Separated Source Line," Fujiwara et al., Jpn. J. Appl. Phys. vol. 39, pp. 417–423, Part 1, No. 2A (Feb. 2000).
U.S. patent application Ser. No. 09/560,626, filed Apr. 28, 2000, N. Johan Knall.

* cited by examiner

Primary Examiner—David Nelms
Assistant Examiner—Ly Duy Pham
(74) Attorney, Agent, or Firm—Brinks Hofer Gilson & Lione

(57) ABSTRACT

A digital memory array includes memory cells having respective anti-fuse layers. Write signals that vary in at least one of current, voltage, and pulse length are applied to selected ones of the memory cells to disrupt the respective anti-fuse layers to differing extents, thereby programming the selected memory cells with resistances that vary in accordance with the degree of anti-fuse layer disruption. The state of a selected memory cell is read by applying a voltage across the cell and comparing the resulting read signal with two or more thresholds, thereby reading more than one bit of digital data from each memory cell.

19 Claims, 1 Drawing Sheet

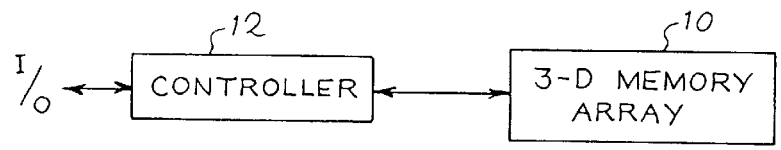
Fig. 1
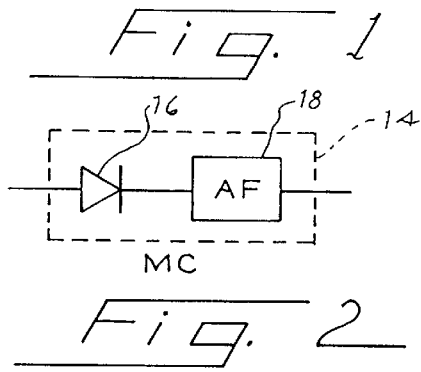
Fig. 2
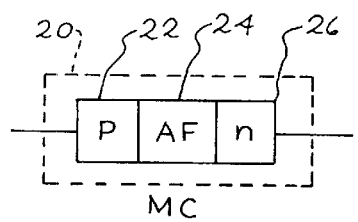
Fig. 3
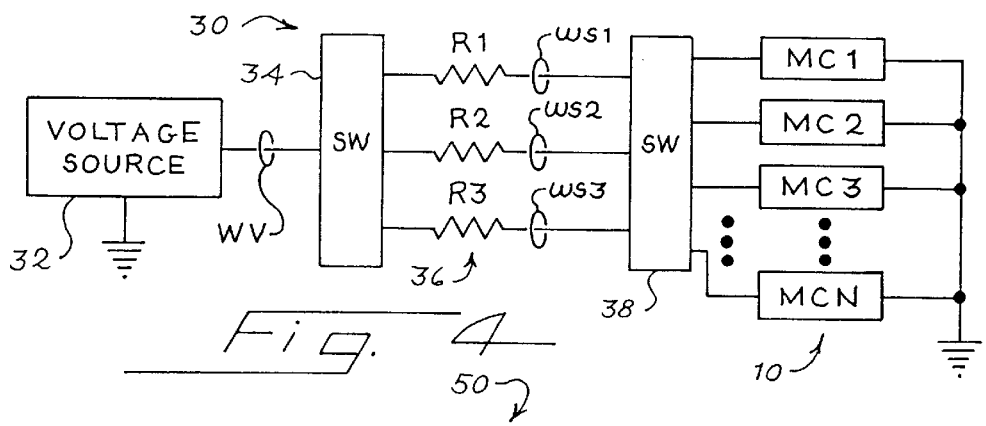
Fig. 4
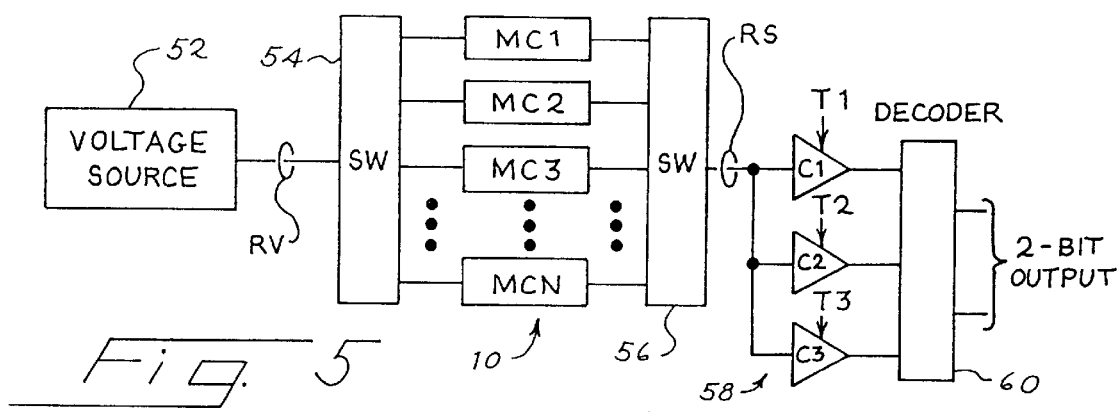
Fig. 5
| C1 | L | H | H | H |
|---|---|---|---|---|
| C2 | L | L | H | H |
| C3 | L | L | L | H |
| OUTPUT | 00 | 01 | 10 | 11 |
Fig. 6
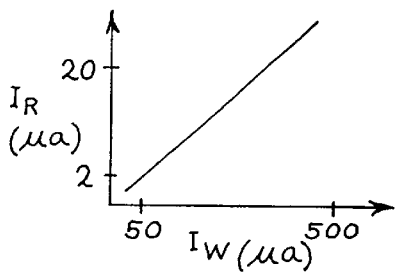
Fig. 7

DIGITAL MEMORY METHOD AND SYSTEM FOR STORING MULTIPLE BIT DIGITAL DATA

BACKGROUND

The present invention relates to digital memory arrays of the type that include anti-fuse layers within the individual memory cells, and in particular to such arrays that provide high-density data storage.

Memory arrays that use anti-fuse layers to store digital data are well known to those skilled in the art. Such arrays operate as write-once memories, and they are generally field programmable. U.S. Pat. No. 6,034,882 and U.S. patent application Ser. No. 09/560,626, both assigned to the assignee of the present invention, disclose two such memory arrays.

The memory arrays of these documents include memory cells that are arranged in three-dimensional arrays. Each memory cell includes a diode and an anti-fuse layer. The anti-fuse layer initially is insulating, and it blocks forward current through the memory cell. The memory cell can be programmed by passing a write current through the memory cell to disrupt the anti-fuse layer, thereby lowering the resistance of the memory cell. The contents of the memory cell can be read as a logic 1 if the memory cell resistance is in a lower range, indicating that the anti-fuse layer has been disrupted, and as a logic 0 if the resistance is at the much higher initial level.

Though the memory arrays discussed above provide high-density, low-cost, write-once memories, further improvements to the data storage density of the array would further lower cost.

SUMMARY

By way of general introduction, the preferred embodiments described below generate two or more write signals that differ in power level. Depending upon which of the write signals is applied to a particular memory cell, the anti-fuse layer of that memory cell is disrupted to a varying extent, and the electrical resistance of that memory cell is programmed accordingly. The contents of the memory cell can be read by applying a voltage across the memory cell and comparing the resulting current with two or more thresholds. In this way, more than two logical states are stored in each memory cell of the array.

The foregoing paragraphs have been provided by way of general introduction, and they should not be used to limit the scope of the following claims.

BRIEF DESCRIPTION OF THE DRAWINGS

FIG. 1 is a schematic diagram of a digital memory that incorporates a preferred embodiment of this invention.

FIGS. 2 and 3 are schematic diagrams of two alternative memory cells that may be used in the memory array of FIG. 1.

FIG. 4 is a schematic representation of a write signal generator coupled to the memory array 10 of FIG. 1.

FIG. 5 is a schematic representation of a read signal generator and a comparator coupled to the memory array 10 of FIG. 1.

FIG. 6 is a table illustrating operation of the decoder 60 of FIG. 5.

FIG. 7 is a graph showing the relationship between write current and read current in one illustrative example.

DETAILED DESCRIPTION OF THE DRAWINGS

Turning now to the drawings, FIG. 1 shows a schematic representation of a digital memory that includes a three-dimensional memory array 10 connected to a memory controller 12. The memory array 10 includes a three-dimensional array of memory cells, made up of two-dimensional layers of memory cells that are stacked on top of one another. FIGS. 2 and 3 show two alternative forms that the individual memory cells can take.

In the example of FIG. 2, the memory cell 14 includes a diode 16 connected in series with an anti-fuse layer 18. The anti-fuse layer 18 initially is highly insulating, and the anti-fuse layer 18 initially limits the forward current through the memory cell 14 to a low value such as $10^{-8}$ or $10^{-9}$ A (for an applied voltage of 2 V). A 3-D memory array including memory cells of the type shown in FIG. 2 can be constructed as shown in U.S. Pat. No. 6,034,882, assigned to the assignee of the present invention and hereby incorporated by reference.

FIG. 3 shows an alternative memory cell 20 that includes first and second semi-conductor regions 22, 26 that are positioned on opposite sides of an anti-fuse layer 24. In this example, the semi-conductor region 22 is a P-type semi-conductor region formed of heavily doped silicon, and the semi-conductor region 26 is an N-type semi-conductor region formed of lightly doped silicon. Once again, in the initial state the anti-fuse layer 24 is highly insulating, and the initial current passed by the memory cell 20 in the forward direction is less than $10^{-8}$ A for an applied voltage of 2 V. A 3-D memory array constructed using a memory cell of the type shown in FIG. 3 is described in detail in U.S. patent application Ser. No. 09/560,626, assigned to the assignee of the present invention and hereby incorporated by reference.

FIG. 4 shows a write signal generator 30 that can be included in the controller 12 and used with the memory array 10. The write signal generator can also exist external to the substrate on which the memory array 10 resides, i.e., "off-chip." The write signal generator 30 includes a voltage source 32 that supplies a write voltage WV to a switch 34. The switch 34 passes the write voltage WV through a selected one of a set of resistors 36. In this example there are three resistors R1, R2, R3 in the set, and each resistor is used to form a respective write signal WS1, WS2, WS3. In general, R1, R2, and R3 are meant to represent the series resistance of the write circuit. The write signals WS1, WS2, WS3 are applied to a switch 38, which routes any selected one of the write signals to any selected one of the memory cells included in the array 10.

The write signals WS1, WS2, WS3 differ from one another in one or more of power, current, voltage, and pulse length. In this example, R2 is of higher resistance than R1, and R3 is of higher resistance than R2. The voltage across the memory cells 10 is fixed at a given value. For this reason, the write signal WS1 is of higher current than the write signal WS2, and the write signal WS2 is of higher current than the write signal WS3.

The write signals WS1, WS2, WS3 are selected in current such that they disrupt the anti-fuse layer of the selected memory cell to different extents, depending upon the current of the write signal. WS1, with the highest current of the write signals, disrupts the anti-fuse layer of the selected memory cell to the greatest extent, thereby producing a memory cell with the lowest forward-biased resistance. The write signal WS2 has a lower current level than the write signal WS1, and it disrupts the anti-fuse layer of the selected memory cell to a lesser extent than does the write signal WS1 (and therefore programs the memory cell to a higher resistance than does WS1). The write signal WS3, with less current than the write signal WS2, disrupts the anti-fuse layer of the selected memory cell to an even lesser extent (and therefore programs the memory cell to a higher resistance than does WS2). Of course, the original, unprogrammed anti-fuse layer is disrupted to an even lesser extent and has the highest resistance.

FIG. 5 provides a schematic representation of a read signal generator 50 and associated components included in the controller 12 of FIG. 1. The system of FIG. 5 can be used to read the state of the anti-fuse layer of any selected one of the memory cells of the array 10 and to produce a two-bit output signal indicative of which of the four states the selected memory cell is in.

The read signal generator 50 of FIG. 5 includes a voltage source 52 that applies a read voltage RV via a switch 54 to any selected one of the memory cells included in the array 10. The read signal RS from the selected memory cell is passed by the switch 56 to a comparator 58. The comparator 58 in this example includes three discrete current comparators C1, C2, C3, each of which is responsive to a respective current threshold signal T1, T2, T3. The output of each of the comparators C1, C2, C3 is in the logic high state when the read signal RS is greater than the associated threshold signal T1, T2, T3, and in the logic low state otherwise.

The decoder 60 responds to the output signals of the comparators C1, C2, C3, and generates a two-bit output signal in response thereto. The logical operation performed by the decoder 60 of FIG. 5 can be as shown in FIG. 6. In this example, when the output signals of all of the comparators C1, C2, C3 are in the logic low state, the associated anti-fuse layer is in the unprogrammed state and the output signal is (0, 0). When the selected memory cell was programmed with the write signal WS3 (the lowest current write signal), the read signal RS will have a current greater than the threshold signal T1 but lower than the threshold signals T2, T3, and the output signal will be (0, 1). Similarly, when the write signal WS2 is used to program a selected memory cell, the associated read signal RS will be characterized by an amperage greater than T1 and T2 but less than T3, and the resulting output signal will be (1, 0). Finally, when the most powerful write signal WS1 is used, the read signal RS of the corresponding memory cell will be greater than all of the threshold signals T1, T2, T3, and the two-bit output signal will be (1, 1).

FIG. 7 shows a graph of an exemplary relationship between the write current $I_w$ used to program a selected memory cell and the associated read current $I_R$ that is measured when a 2 V read voltage RV is applied to the selected memory cell.

Table 1 provides an illustrative listing of the parameters discussed above and typical values that can be used in one embodiment. In this example each write pulse has an average duration of 2 microseconds.

TABLE 1

| Parameter (FIGS. 4 & 5) | Illustrative Value |
| --- | --- |
| R1 | 10 kOhm |
| R2 | 50 kOhm |
| R3 | 100 kOhm |
| T1 | 500 nA |
| T2 | 1 micro A |
| T3 | 10 micro A |
| WV | 8 V |
| RV | 2 V |

From the foregoing, it should be apparent that the embodiment described above programs individual memory cells in such a manner that more than one bit of digital data can be stored in each memory cell. In the illustrated example, there are three different write signals and two bits are stored in each memory cell. The write signals alter the anti-fuse layer to varying extents, thereby causing the programmed memory cells to assume one of three programmed values of electrical resistance. The state of a memory cell is read by applying a voltage across the memory cell and then making a measurement of a parameter that varies in accordance with the resistance of the memory cell, such as a measurement of voltage, current or power.

Though the foregoing example is suitable for storing two bits in each memory cell, this is not essential. In one alternative form there are only two write signals that differ in current, and each memory cell assumes one of three states (programmed with a higher current write signal, programmed with a lower current write signal, and unprogrammed). Similarly, more than three write signals that differ in current can be used, and more than two bits can be stored in each memory cell.

This invention is not limited to the particular memory cells described above, and a wide variety of memory cells employing field-programmable anti-fuse layers can be used. Similarly, the write and read signal generators discussed above have been presented schematically, and a wide variety of technologies and designs can be used to implement the illustrated functions. Also, the particular values provided in Table 1 should not be taken as limiting, because they can be varied widely depending upon the application and the technology used to implement the specific components.

Write signals can be made to vary in power by varying the current, voltage, or pulse width of the write signal. The parameter of the read signal that is measured to determine the state of a memory cell can be current, voltage or any function of current and/or voltage that varies as a function of the resistance of the associated memory cell. Though the invention has been described for use in conjunction with a three-dimensional memory, it can also be applied to conventional two-dimensional memories.

As used herein the term "level" is intended broadly to encompass a range of levels.

Similarly, the term "comparator" is intended broadly and it can include one or more component devices. For example, a single comparator can be time shared among multiple thresholds, or a comparator can include multiple individual comparators as shown in the drawings.

The foregoing detailed description has discussed only a few of the many forms that this invention can take. For this reason, this detailed description is intended by way of example, and not by way of limitation. It is only the following claims, including all equivalents, that are intended to define the scope of this invention.

What is claimed is:

1. A method for storing digital data, said method comprising:

(a) providing at least three memory cells, each memory cell comprising a respective anti-fuse layer and characterized by an initial level of electrical resistance;

(b) applying a first write signal to a first one of the memory cells, thereby altering the respective anti-fuse layer and causing the respective memory cell to assume a first level of electrical resistance different from the initial level;

(c) applying a second write signal to a second one of the memory cells, thereby altering the respective anti-fuse layer and causing the respective memory cell to assume a second level of electrical resistance different from the initial level, said first and second write signals differing in at least one of voltage, current and pulse length, and said first and second levels differing in electrical resistance;

(d) reading at least three digital states from the memory cells subsequent to (b) and (c) in accordance with the respective levels of electrical resistance.

2. The method of claim 1 wherein each memory cell comprises a respective diode connected in series with the respective anti-fuse layer.

3. The method of claim 1 wherein each memory cell comprises a respective first semiconductor region disposed on a first side of the respective antifuse layer and a respective second semiconductor region disposed on a second side of the respective antifuse layer, opposite the respective first semiconductor region.

4. The method of claim 3 wherein the first and second semiconductor regions of each memory cell are doped with opposite polarities.

5. The method of claim 1 wherein the first and second write signals differ in current.

6. The method of claim 1 wherein the first and second write signals differ in voltage.

7. The method of claim 1 wherein the first and second write signals differ in pulse length.

8. The method of claim 1:

wherein at least four memory cells are provided in (a);

wherein the method further comprises (e) applying a third write signal to a third one of the memory cells, thereby altering the respective anti-fuse layer and causing the respective memory cell to assume a third level of electrical resistance, different from the initial level;

wherein the first, second and third write signals differ in at least one of voltage, current, and pulse length;

wherein the first, second and third levels differ in electrical resistance; and wherein (d) comprises reading at least four digital states subsequent to (b), (c) and (e) in accordance with the respective levels of electrical resistance.

9. The method of claim 1 wherein (d) comprises:

(d1) applying a voltage across the first, second and third memory cells, thereby generating first, second, and third read signals, respectively; and (d2) making a current measurement of the first, second, and third read signals.

10. The method of claim 1 wherein the memory array comprises multiple two-dimensional layers of the memory cells, and wherein the layers are stacked on top of one another such that the memory array comprises a three-dimensional array of the memory cells.

11. A digital memory system comprising:

a memory array comprising a plurality of memory cells, each memory cell comprising a respective anti-fuse layer and characterized by an initial level of electrical resistance;

a write signal generator coupled with the memory array and operative to apply write signals comprising at least first and second write signals having first and second different levels of at least one of voltage, current and pulse length to selected memory cells, thereby altering the associated anti-fuse layers and electrical resistance of the associated memory cells;

a read signal generator coupled with the memory array and operative to generate a read signal that varies in at least one of voltage and current in accordance with an electrical resistance of a selected memory cell; and a comparator responsive to the read signal and operative to compare the read signal with at least two different thresholds.

12. The system of claim 11 wherein each memory cell comprises a respective diode connected in series with the respective anti-fuse layer.

13. The system of claim 11 wherein each memory cell comprises a respective first semiconductor region disposed on a first side of the respective antifuse layer and a respective second semiconductor region disposed on a second side of the respective antifuse layer, opposite the respective first semiconductor region.

14. The system of claim 13 wherein the first and second semiconductor regions of each memory cell are doped with opposite polarities.

15. The system of claim 11 wherein the first write signal differs in current as compared with the second write signal.

16. The system of claim 11 wherein the first write signal differs in voltage in the first power level as compared with the second write signal.

17. The system of claim 11 wherein the first write signal differs in pulse length as compared with the second write signal.

18. The system of claim 11 wherein the write signal generator is operative to apply the write signals with at least first, second, and third different levels of at least one of voltage, current and pulse length to selected memory cells, and wherein the comparator is operative to compare the read signal with at least three different thresholds.

19. The system of claim 11 wherein the memory array comprises multiple two-dimensional layers of the memory cells, and wherein the layers are stacked on top of one another such that the memory array comprises a three-dimensional array of the memory cells.

* * * * *

UNITED STATES PATENT AND TRADEMARK OFFICE
CERTIFICATE OF CORRECTION

PATENT NO.    : 6,490,218 B1                                          Page 1 of 1
DATED         : December 3, 2002
INVENTOR(S)   : Michael A. Vyvoda et al.

It is certified that error appears in the above-identified patent and that said Letters Patent is hereby corrected as shown below:

<u>Title page,</u>
Item [56], U.S. PATENT DOCUMENTS, insert:
-- 6,376,284    4/2002  Gonzalez et al.  438/129 --.

Signed and Sealed this

Nineteenth Day of August, 2003

JAMES E. ROGAN
*Director of the United States Patent and Trademark Office*